United States Patent
Oki

(10) Patent No.: US 10,881,026 B2
(45) Date of Patent: Dec. 29, 2020

(54) OPTICAL TRANSCEIVER

(71) Applicant: Sumitomo Electric Industries, Ltd., Osaka (JP)

(72) Inventor: Kazushige Oki, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/577,362

(22) Filed: Sep. 20, 2019

(65) Prior Publication Data

US 2020/0100391 A1    Mar. 26, 2020

(30) Foreign Application Priority Data

Sep. 20, 2018 (JP) ................................ 2018-176474

(51) Int. Cl.
| | | |
|---|---|---|
| *H04B 10/40* | (2013.01) | |
| *H05K 7/20* | (2006.01) | |
| *G02B 6/42* | (2006.01) | |

(52) U.S. Cl.
CPC ....... *H05K 7/20472* (2013.01); *G02B 6/4201* (2013.01); *H04B 10/40* (2013.01)

(58) Field of Classification Search
CPC ... H04B 10/40; H05K 7/20472; G02B 6/4201
See application file for complete search history.

(56) References Cited

U.S. PATENT DOCUMENTS

| | | | | |
|---|---|---|---|---|
| 2009/0010653 A1* | 1/2009 | Aoki | ...................... | H04B 10/40 10/40 |
| 2011/0103797 A1* | 5/2011 | Oki | ...................... | G02B 6/4243 398/79 |
| 2011/0293284 A1* | 12/2011 | Zhong | .................. | G02B 6/4201 398/135 |
| 2012/0045181 A1* | 2/2012 | Ishii | ...................... | G02B 6/4283 385/92 |
| 2013/0136458 A1* | 5/2013 | Kawase | ............... | H05K 9/0058 398/135 |
| 2016/0103286 A1* | 4/2016 | Matsui | ................. | G02B 6/2843 398/139 |
| 2018/0085593 A1* | 3/2018 | Fayram | ................ | A61N 1/3756 |

FOREIGN PATENT DOCUMENTS

| | | |
|---|---|---|
| EP | 1 557 704 B1 | 7/2005 |
| JP | 2007-155863 A | 6/2007 |
| JP | 2011-215620 A | 10/2011 |
| JP | 2012-064936 A | 3/2012 |
| JP | 2014-119712 A | 6/2014 |

* cited by examiner

*Primary Examiner* — Dzung D Tran
(74) *Attorney, Agent, or Firm* — Baker Botts L.L.P.; Michael A. Sartori

(57) ABSTRACT

An optical transceiver according to one embodiment includes a housing having an inner space and inner planes that face to each other and define the inner space, a TOSA including a package and a sleeve attached to the package, the sleeve being fixed to the housing, the package being housed in the inner space, a heat conductive gel that is plastic or deformable and closely sandwiched between the package and one of the inner planes, a fitting member in contact with the other of the inner planes and detachably fixed to the housing, and a resin member closely sandwiched between the package and the fitting member.

5 Claims, 13 Drawing Sheets

OPTICAL TRANSCEIVER

TECHNICAL FIELD

One aspect of the present disclosure relates to an optical transceiver.

BACKGROUND

An optical transceiver including an optical sub-assembly on which a light emitting element is mounted and a circuit board on which an IC is mounted is described in Japanese Unexamined Patent Publication No. 2012-64936. The optical sub-assembly and the circuit board are covered by a heat dissipating cover. The optical sub-assembly is formed of a ceramic package, and a heat dissipating plane is provided on a back plane of the ceramic package adjacent to the circuit board. The heat dissipating plane is disposed perpendicular to a heat dissipating contact plane of the heat dissipating cover, and a heat dissipating block is thermally coupled to the heat dissipating plane. The heat dissipating block is slidably fixed in close contact with the heat dissipating contact plane of the heat dissipating cover.

A heat dissipating structure of an optical transceiver including a butterfly type optical module having a sleeve portion and a box portion, and a housing in which the optical module is housed is described in Japanese Unexamined Patent Publication No. 2007-155863. The sleeve portion is directly fixed to an inner plane of the housing, and the box portion is fixed to the inner plane of the housing with a fitting member interposed. Heat conductive grease and an elastic member are closely sandwiched between the box portion and the fitting member.

An optical communication module is described in Japanese Unexamined Patent Publication No. 2011-215620. The optical communication module includes an optical transmitter including a light emitting element and a TEC, an optical receiver including a light receiving element, and a housing in which the optical transmitter and the optical receiver are housed. Provided between the optical transmitter and an inner plane of the housing are a first connecting member in contact with the optical transmitter, a second connecting member in contact with the inner plane of the housing, and a metal plate closely sandwiched between the first connecting member and the second connecting member. The first connecting member and the second connecting member are both smaller in heat conductivity than the metal plate. Accordingly, the optical transmitter and the housing are thermally connected to each other with the first connecting member, the metal plate, and the second connecting member interposed.

An optical communication module including a housing, an optical transmitting element, a plurality of heat dissipating sheets, a circuit board, and a graphite sheet member is described in Japanese Unexamined Patent Publication No. 2014-119712. In the housing, the optical transmitting element, the graphite sheet member, the plurality of heat dissipating sheets, and the circuit board are housed. The graphite sheet member extends from between the optical transmitting element and a heat dissipating sheet laid on a bottom wall of the housing to between a different heat dissipating sheet and the bottom wall of the housing. Accordingly, the optical transmitting element is thermally connected to the bottom wall with the heat dissipating sheet laid on the bottom wall of the housing and the graphite sheet member interposed.

An optical module including a cabinet and a cover is described in United States Patent Application No. 2009/010653. In the cabinet, an electric board, an optical transceiver part, a fixing member, and a heat conductive sheet are housed. The fixing member is in contact with an inner plane of the cover. The heat conductive sheet is closely sandwiched between the fixing member and the optical transceiver part. Accordingly, heat of the optical transceiver part is conducted to the cover through the heat conductive sheet and the fixing member.

An optical transceiver including a circuit board, an optical sub-assembly, a heat conducting member, and a housing is described in European Patent No. 1557704. The circuit board, the optical sub-assembly, and the heat conducting member are housed in the housing. The heat conducting member is disposed between the optical sub-assembly and the circuit board, and the heat conducting member extends in part out of the housing. The heat conducting member dissipates heat generated in the optical sub-assembly to the outside of the housing through the heat conducting member.

SUMMARY

An optical transceiver according to one aspect of the present disclosure includes an inner space, a housing having a first plane and a second plane facing to each other, the first plane and the second plane defining the inner space, an optical module including a package and a sleeve attached to the package, the sleeve being fixed to the housing, the package being housed in the inner space, a heat conductive member closely sandwiched between the package and the first plane, the heat conductive member being plastic or deformable, a fitting member in contact with the second plane and detachably fixed to the housing, and a resin member closely sandwiched between the package and the fitting member.

DETAILED DESCRIPTION

Figure 1:
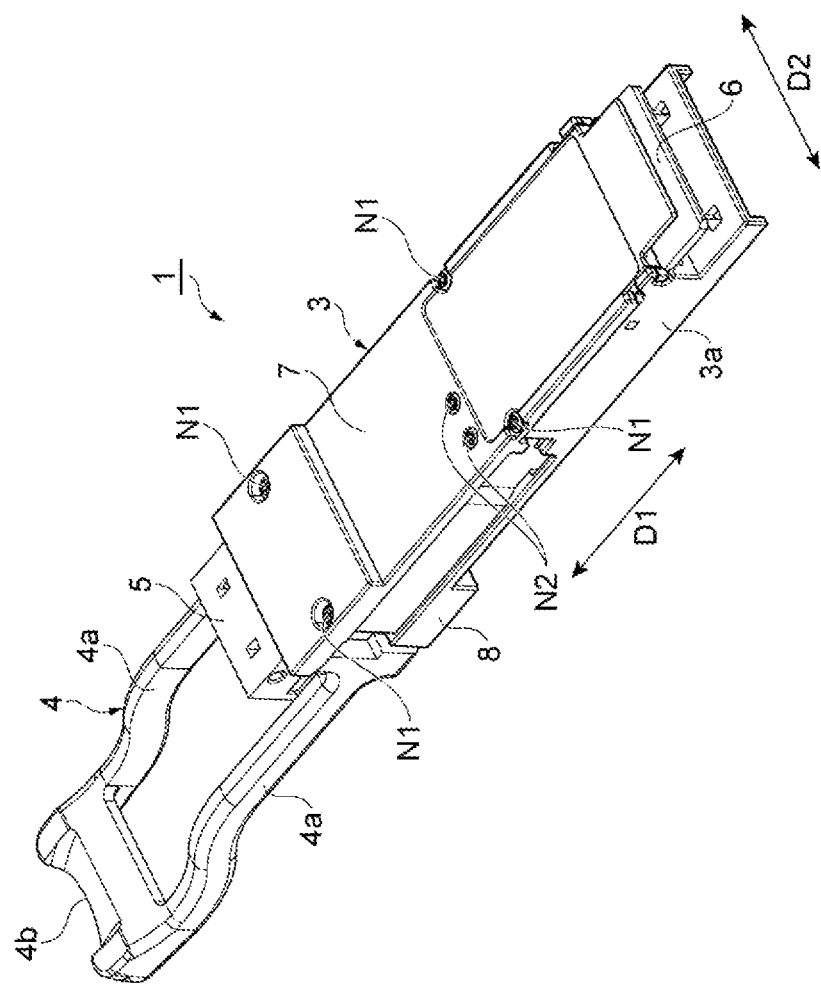
FIG. 1 is a perspective view showing an optical transceiver according to a first embodiment of the present disclosure.

A description will be given below of specific examples of an optical transceiver according to embodiments of the present disclosure with reference to the drawings. It should be noted that the present disclosure is not limited to the following examples, and is intended to be defined by the claims and to include all modifications within the scope of the claims and their equivalents. In the following description, that is, in the description given with reference to the drawings, the same or equivalent components are denoted by the same reference numerals, and any redundant description will be omitted as appropriate. Further, the drawings may be simplified or exaggerated in part for ease of understanding, and dimensional ratios and the like are not limited to those described in the drawings.

First Embodiment

Figure 2:
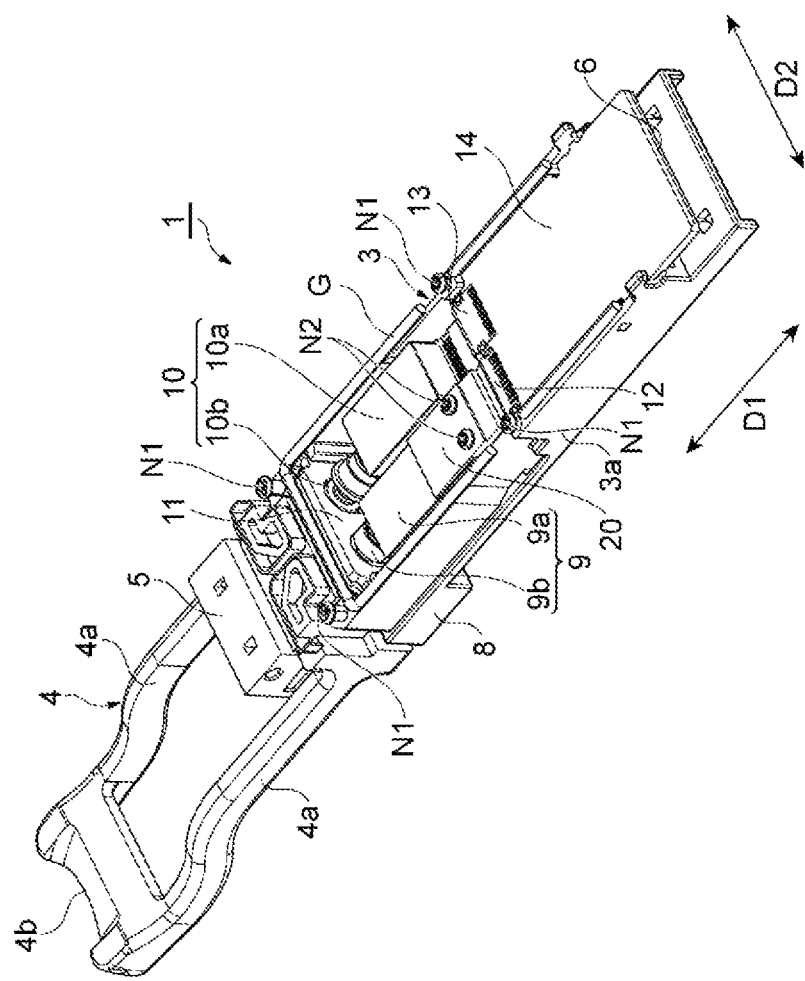
FIG. 2 is a perspective view showing an internal structure of the optical transceiver show in FIG. 1.

FIG. 1 is a perspective view showing an optical transceiver 1 according to a first embodiment. FIG. 2 is a perspective view showing an internal structure of the optical transceiver 1. As shown in FIGS. 1 and 2, the optical transceiver 1 conforms to, for example, the QSFP28 standard and performs full-duplex bidirectional optical communication. The optical transceiver 1 is mated to and unmated from (inserted into and removed from) a cage provided on a host system in a direction D1 that is a longitudinal direction of the optical transceiver 1. The optical transceiver 1 includes a housing 3 and a pull tab 4, and the housing 3 and the pull tab 4 both have shapes extending in the direction D1. The housing 3 is made of metal. A cross-sectional shape of the housing 3 orthogonal to the direction D1 is, for example, a rectangular shape. The housing 3 has a pair of side planes 3a extending in the direction D1.

The pull tab 4 is made of a deformable material such as resin. The pull tab 4 has a pair of arm portions 4a extending from an end in the direction D1 of the housing 3 and a connecting portion 4b connecting tips of the pair of arm portions 4a. When the pull tab 4 is held and pulled in the direction D1, the optical transceiver 1 is disengaged from the host system, allowing the optical transceiver 1 to be pulled out of the host system.

The housing 3 includes a receptacle 5 to be engaged with an optical connector provided at a tip of an optical fiber cable. The receptacle 5 is provided at one end in the direction D1 of the housing 3. The housing 3 further includes, at the other end in the direction D1, an electrical plug 6 to be connected to an electrical connector provided inside the cage of the host system. Note that, in the following description, one end side (receptacle 5 side) of the housing 3 may be referred to as a front, and the other end side (electrical plug 6 side) of the housing 3 may be referred to as a rear.

The housing 3 includes a lower housing 7 and an upper housing 8. The lower housing 7 and the upper housing 8 are joined to each other with a plurality of screws N1 with a gasket G closely sandwiched. In the housing 3, a transmitter optical sub-assembly (TOSA) 9, a receiver optical sub-assembly (ROSA) 10, and a retainer 11 are housed. The TOSA 9 and the ROSA 10 are optical modules installed in parallel to each other in a direction D2 that is a width direction of the optical transceiver 1. The retainer 11 is made of, for example, a conductive material.

The TOSA 9 includes a package 9a and a sleeve 9b extending from the package 9a. The package 9a has a rectangular parallelepiped shape, and the sleeve 9b has a tubular shape protruding from a side plane (front plane) of the package 9a. The ROSA 10 includes a package 10a and a sleeve 10b similar to the package 9a and the sleeve 9b. The sleeve 9b and the sleeve 10b are fixed to the upper housing 8 by the retainer 11.

The sleeve 9b and the sleeve 10b are arranged such that their respective front sides protrude into the receptacle 5 from the rear. An optical fiber is inserted through each of the sleeve 9b and the sleeve 10b. The optical fiber and a semiconductor device (an LD, a PD, or the like) mounted on each of the TOSA 9 and the ROSA 10 are optically coupled to each other through optical alignment. During this optical alignment, while moving each of the sleeve 9b and the sleeve 10b in a direction (XY direction) orthogonal to an optical axis of the optical fiber, an optical signal passing through the optical fiber is detected outside the TOSA 9 and the ROSA 10. Then, the sleeve 9b and the sleeve 10b are fixed to the package 9a and the package 10a, respectively, at positions where the detected optical signal shows its peak. The state where the detected optical signal shows its peak corresponds to, for example, a state where an optical axis of the sleeve 9b and an optical axis of the package 9a are approximately aligned with each other. Accordingly, an optimum coupling efficiency can be obtained through such optical alignment (the same applies to an optical axis of the sleeve 10b and an optical axis of the package 10a). An optical system of the TOSA 9 has variations in the position of the optical axis relative to a design value due to tolerances or errors in dimension of components that constitute the optical system or in assembly position of the components. The optical alignment is made to compensate for a decrease in coupling efficiency due to such positional deviation of the optical axis. More specifically, relative positions of the sleeve 9b and the package 9a after the optical alignment vary depending on individual differences. Such a variation in relative position corresponds to a misalignment amount to be described later. The sleeve 9b and the sleeve 10b are each made of, for example, steel use stainless (SUS), and are fixed to the package 9a and the package 10a, respectively, by YAG welding.

In the housing 3, FPC boards 12, 13 and a circuit board 14 are further housed. The FPC board 12 electrically connects the TOSA 9 to the circuit board 14. The FPC board 13 electrically connects the ROSA 10 to the circuit board 14. The ROSA 10 converts an optical signal received from the outside of the optical transceiver 1 into an electrical signal. The electrical signal is transmitted to the circuit board 14 through the FPC board 13.

A circuit mounted on the circuit board 14 performs signal processing on the electrical signal, and the electrical signal is output to the host system through the electrical plug 6. On the other hand, an electrical signal to be transmitted is input from the host system to the circuit board 14 through the electrical plug 6. The electrical signal is processed by the circuit mounted on the circuit board 14 and then transmitted to the TOSA 9 through the FPC board 12. The TOSA 9 converts the electrical signal into an optical signal and then outputs the optical signal to the outside of the optical transceiver 1.

Figure 3:
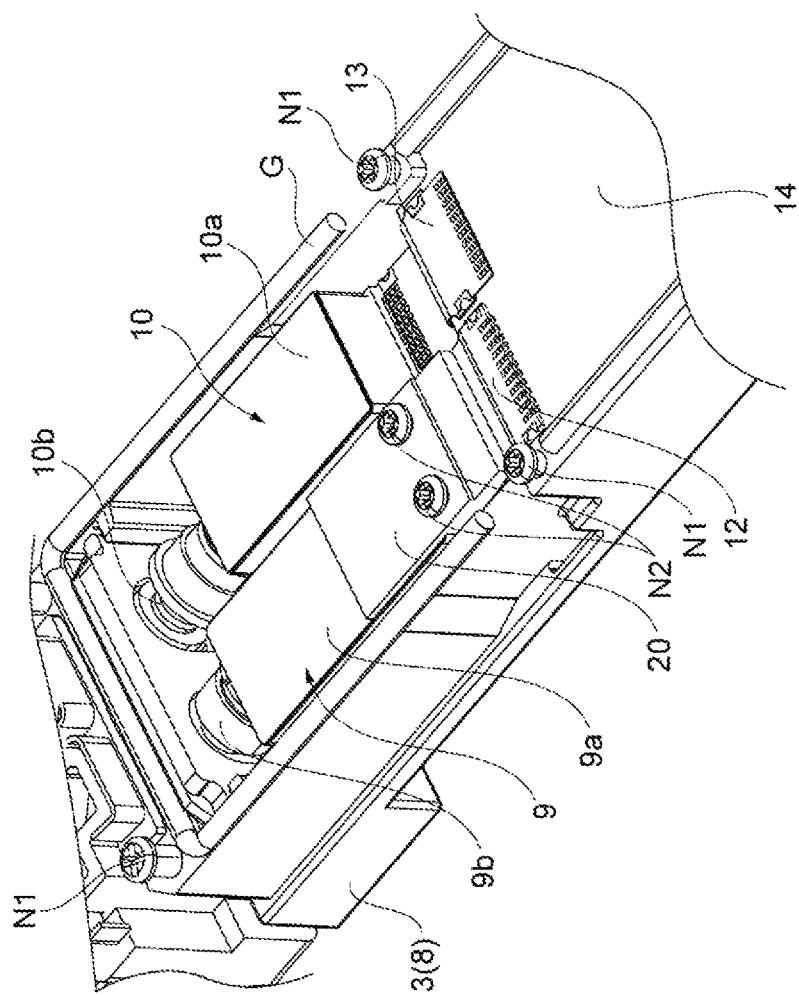
FIG. 3 is an enlarged perspective view of an optical module and a fitting member of the optical transceiver shown in FIG. 1.

FIG. 3 is an enlarged perspective view of the TOSA 9 and the ROSA 10 in the optical transceiver 1. As shown in FIG. 2 and FIG. 3, the optical transceiver 1 includes a fitting member 20 closely sandwiched between the TOSA 9 and the lower housing 7. The fitting member 20 is made of, for example, metal, more specifically, made of aluminum, zinc, or SUS. The fitting member 20 may be identical in linear expansion coefficient to the housing 3. This makes it possible to suppress a positional deviation of the fitting member 20 due to temperature change, and the like.

Figure 4:
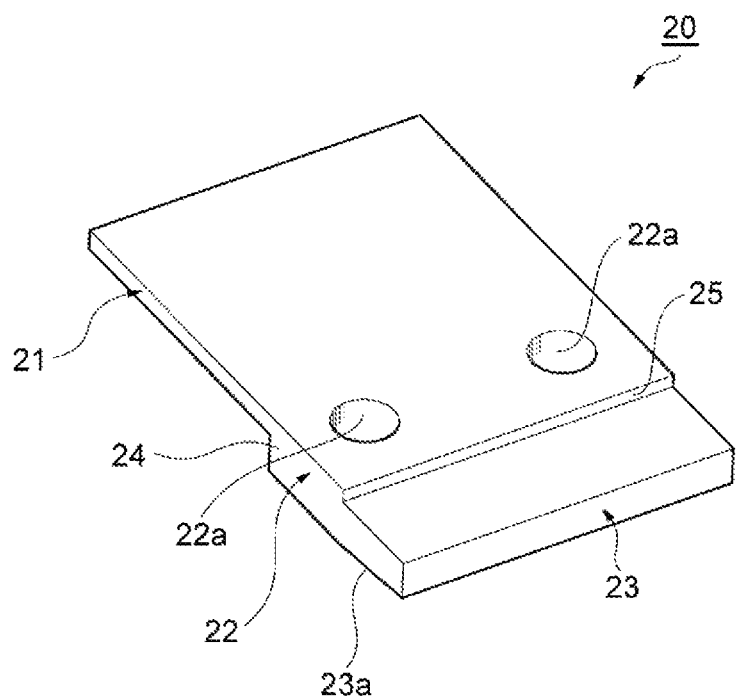
FIG. 4 is a perspective view showing the fitting member shown in FIG. 3.

FIG. 4 is a perspective view showing the fitting member 20. As shown in FIG. 4, the fitting member 20 has a mounting portion 21 to be placed on the package 9a of the TOSA 9, a fixing portion 22 having threaded holes 22a and to be fixed to the lower housing 7, and an extending portion 23 extending from the fixing portion 22 in a direction opposite to the direction in which the mounting portion 21 extends. The mounting portion 21 has a flat-plate shape. A thickness of the mounting portion 21 is thinner than a thickness of the fixing portion 22. The fixing portion 22 is continuous with the mounting portion 21 with a step portion 24 interposed, the step portion 24 protruding in an out-of-plane direction of the mounting portion 21 from an end of the mounting portion 21 in the longitudinal direction of the fitting member 20.

The fixing portion 22 has a rectangular shape extending long in a width direction of the fitting member 20. The pair of threaded holes 22a are provided in the width direction of the fitting member 20. The pair of threaded holes 22a are symmetrically formed about a center in the width direction of the fitting member 20, for example. Formed between the fixing portion 22 and the extending portion 23, a step portion 25 protruding from the extending portion 23 to the fixing portion 22. The step portion 25 is formed on a plane opposite from the step portion 24. A plane on the opposite side of the extending portion 23 from the step portion 25 is an oblique plane 23a that is oblique so as to be thinner toward an end in the longitudinal direction of the fitting member 20.

Figure 5:
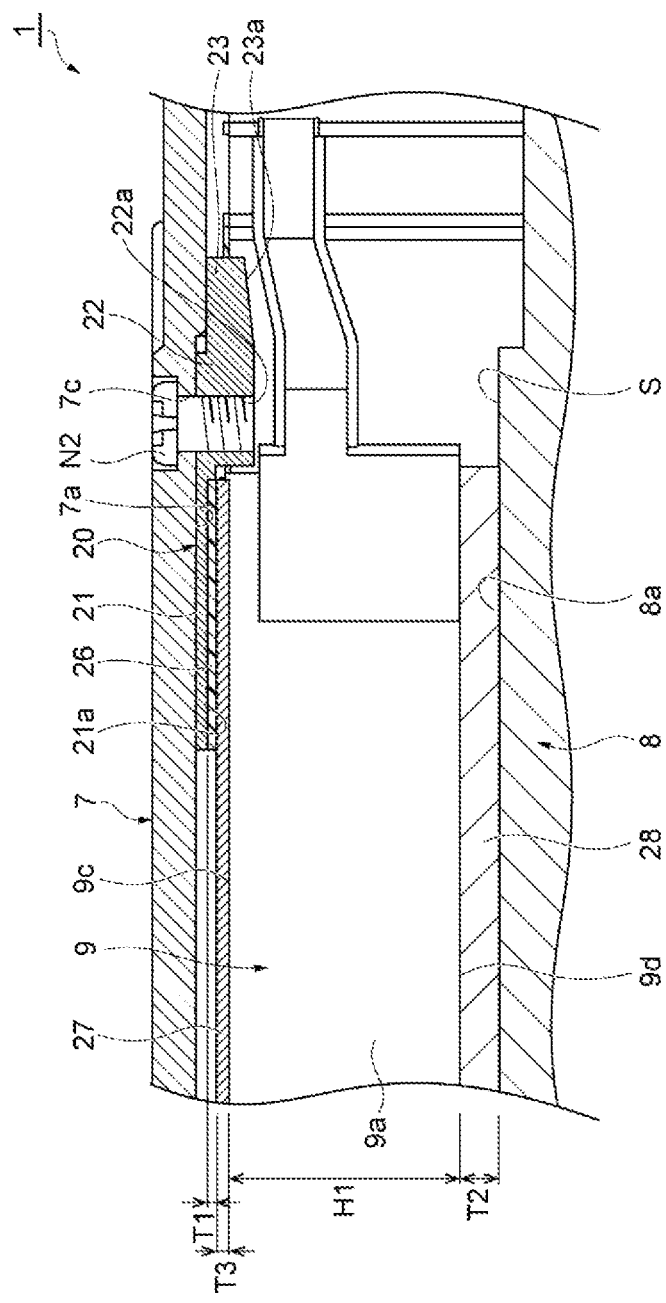
FIG. 5 is a longitudinal cross-sectional view of the optical transceiver shown in FIG. 1.

FIG. 5 is a cross-sectional view showing the TOSA 9, the fitting member 20, the lower housing 7, and the upper housing 8. As shown in FIG. 5, an inner space S of the optical transceiver 1 is formed between the lower housing 7 and the upper housing 8. In the inner space S, the fitting member 20, a resin member 26, a name plate 27, the TOSA 9, and a heat conductive gel 28 are housed. The mounting portion 21 of the fitting member 20 is, for example, placed on a bottom plane 9c of the package 9a of the TOSA 9 with the resin member 26 and the name plate 27 interposed.

The bottom plane 9c is a plane of the package 9a that faces to the lower housing 7 and has, for example, a flat shape. The resin member 26 is, for example, a member that fixes the fitting member 20 to the name plate 27 and is closely sandwiched between a facing plane 21a of the mounting portion 21 and the name plate 27. The resin member 26 extends like a flat plate between the facing plane 21a and the name plate 27. For example, on the name plate 27, a serial number identifying the TOSA 9 is inscribed. The name plate 27 is fixed to the package 9a. Note that when the serial number is inscribed on the package 9a, the name plate 27 may be omitted. In this case, the resin member 26 is closely sandwiched between the facing plane 21a of the mounting portion 21 and the bottom plane 9c of the package 9a and extends like a flat plate. The mounting portion 21 of the fitting member 20 is placed on the bottom plane 9c of the package 9a of the TOSA 9 with the resin member 26 interposed.

Figure 6:
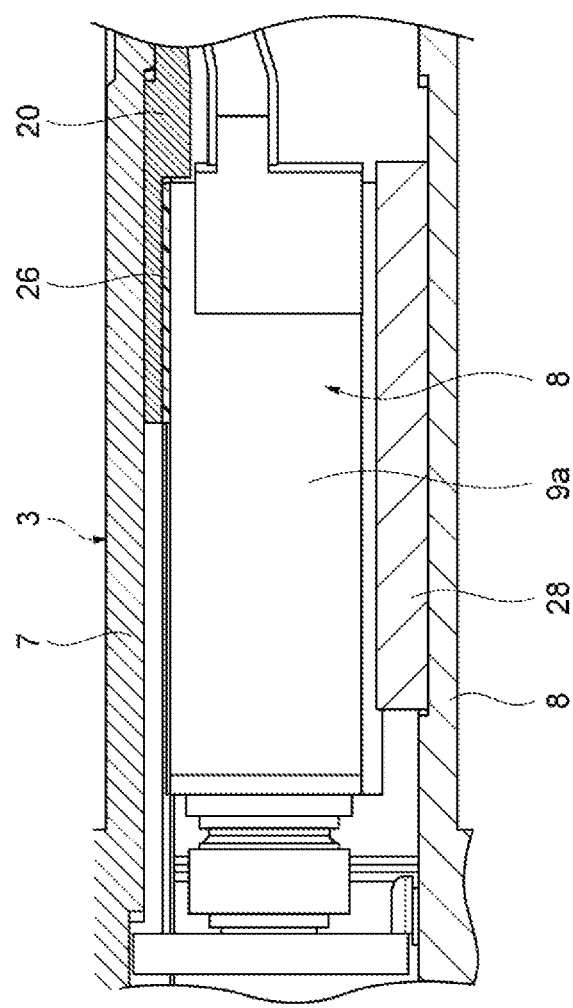
FIG. 6 is a longitudinal cross-sectional view showing a state where the optical module of the optical transceiver shown in FIG. 1 is slightly misaligned.
Figure 7:
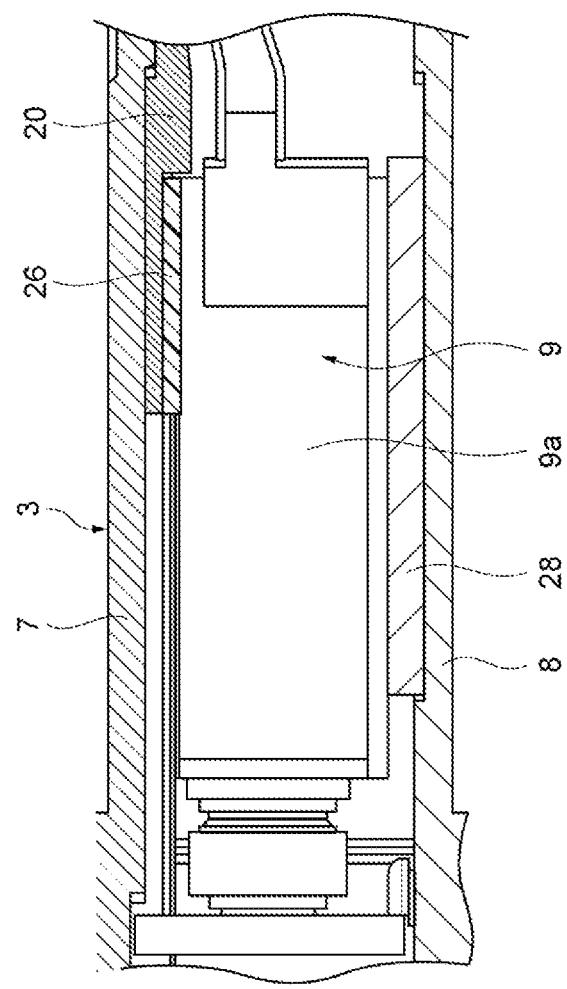
FIG. 7 is a longitudinal cross-sectional view showing a state where the optical module of the optical transceiver shown in FIG. 1 is not misaligned.
Figure 8:
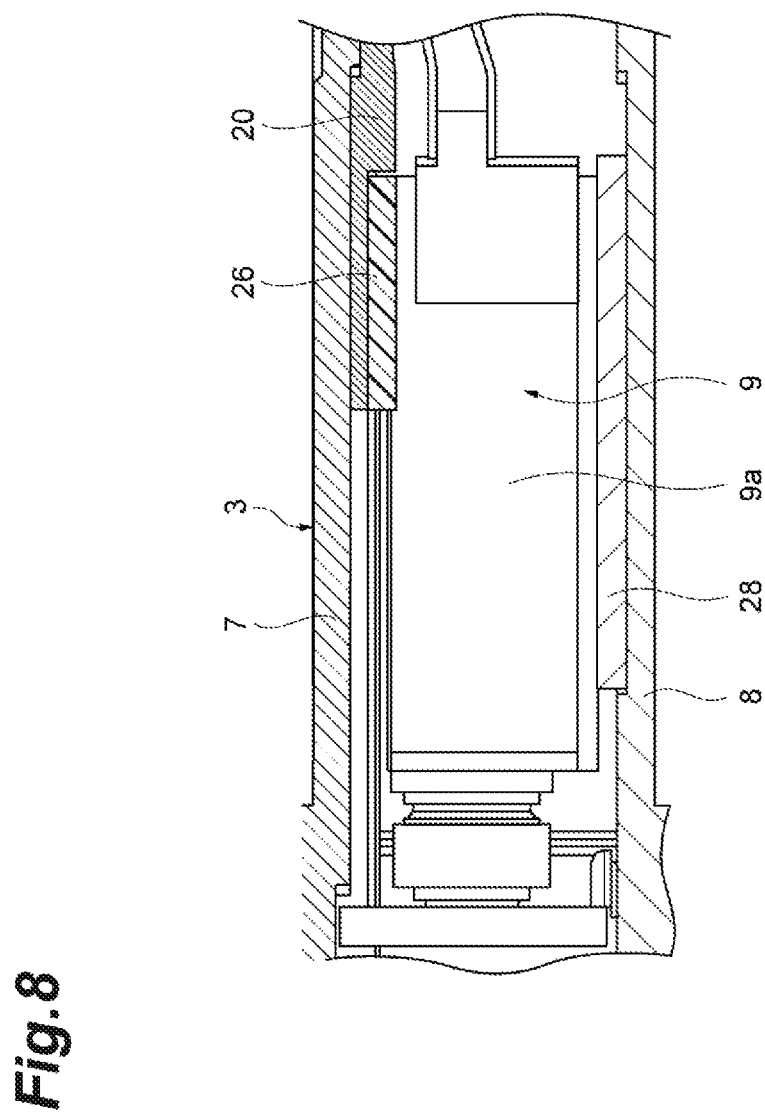
FIG. 8 is a longitudinal cross-sectional view showing a state where the optical module of the optical transceiver shown in FIG. 1 is misaligned in a direction opposite to the misalignment direction of FIG. 6.

The resin member 26 is in liquid form while being injected into a space between the fitting member 20 and the package 9a. For example, the resin member 26 is made of a material deformable during injection such as a material in liquid form. The resin member 26 hardens with time after injection. In order to accelerate the hardening, the resin member 26 may be heated or irradiated with ultraviolet rays as required. Only a desired amount of the resin member 26 in liquid form can be injected into the space between the fitting member 20 and the package 9a. Specifically, as shown in FIGS. 6 to 8, it is possible to inject the resin member 26 such that thicknesses of the resin member 26 vary with the misalignment amount of the package 9a. Note that the misalignment indicates an error (deviation) of the position of the package 9a relative to the housing 3 (for example, a gap between the lower housing 7 and the package 9a) in a vertical direction (a direction orthogonal to both the longitudinal direction D1 and the width direction D2). The misalignment amount indicates an amount of the error (deviation). The misalignment amount is obtained through the above-described optical alignment made during assembly of the TOSA 9 or the ROSA 10.

FIG. 6 shows a state where the misalignment amount of the package 9a is −0.3 mm, FIG. 7 shows a state where the misalignment amount of the package 9a is 0 mm, and FIG. 8 shows a state where the misalignment amount of the package 9a is 0.3 mm. The package 9a shown in FIG. 6 is positioned closer to the lower housing 3 than the package 9a shown in FIG. 7, and the package 9a shown in FIG. 8 is positioned farther from the lower housing 3 than the package 9a shown in FIG. 7. Since the misalignment occurs in a direction orthogonal to the optical axis, for example, when the longitudinal direction (D1) is a direction of the optical axis, the misalignment occurs in the lateral direction (D2) and the vertical direction. The misalignment amounts in FIGS. 6 to 8 represent values in the vertical direction only. As shown in FIGS. 6 to 8, the resin member 26 is adjusted in thickness in accordance with the misalignment amount of the package 9a when the resin member 26 is in liquid form. The greater the misalignment amount of the package 9a is (the larger the gap between the lower housing 7 and the package 9a is), the greater the thickness of the resin member 26 becomes, and the less the misalignment amount of the package 9a is (the smaller the gap between the lower housing 7 and the package 9a is), the less the thickness of the resin member 26 becomes. In the optical transceiver 1 according to the present embodiment, for example, the misalignment amount of the package 9a is −0.3 mm or more and 0.3 mm or less.

As a specific example, when the misalignment amount of the package 9a is −0.3 mm, the thickness of the resin member 26 is 0.05 mm. When the misalignment amount of the package 9a is 0 mm, the thickness of the resin member 26 is 0.35 mm. When the misalignment amount of the package 9a is 0.3 mm, the thickness of the resin member 26 is 0.65 mm. As described above, the resin member 26 in liquid form can be injected while being adjusted in thickness and harden with time after the injection to fix the fitting member 20 and the package 9a to each other. The resin member 26 is, for example, an adhesive.

As shown in FIG. 5, when the mounting portion 21 is placed on the bottom plane 9c, the fixing portion 22 of the fitting member 20 is positioned to cause the threaded holes 22a to communicate with screw holes 7c of the lower housing 7. Inserting screws N2 into the screw holes 7c and the threaded holes 22a from the outside of the lower housing 7 in a state where the threaded holes 22a communicate with the screw holes 7c fixes the fixing portion 22 to an inner plane 7a of the lower housing 7. That is, inserting the screws N2 into the screw holes 7c and the threaded holes 22a and driving the screws N2 into the threaded holes 22a mechanically fixes the fitting member 20 to the lower housing 7. The screw holes 7c of the lower housing 7 are enlarged on an outer plane side of the lower housing 7, and heads of the screws N2 are placed onto the enlarged portions of the screw holes 7c. The screw holes 7c are counterbored to allow the heads of the screws N2 to sit flush with the lower housing 7.

The oblique plane 23a of the extending portion 23 faces toward the inside of the optical transceiver 1. Further, the fitting member 20 is fixed to the lower housing 7 with the screws N2, so that the fitting member 20 is detachably fixed to the lower housing 7. That is, the use of the screws N2 as a fixing means allows, when maintenance such as replacement of the fitting member 20, the resin member 26, the name plate 27 and the TOSA 9, or the heat conductive gel 28 is required, these components to be easily removed from the housing 3, allowing rework to be easily made.

According to the present embodiment, the TOSA 9 is a component that performs photoelectric conversion and thus generates heat, which requires that heat generated by the TOSA 9 be dissipated. The heat conductive gel 28 is closely sandwiched between the TOSA 9 and an inner plane 8a of the upper housing 8. The heat conductive gel 28 is a gel heat conductive member having elasticity and heat conductivity. The heat conductive gel 28 is injected into a space between the inner plane 8a and a top plane 9d of the package 9a facing in a direction opposite to the direction in which the bottom plane 9c faces to come into contact with the package 9a and the upper housing 8. The heat conductive gel 28 is injected in contact with the package 9a and the upper housing 8 to form a heat conductive path with a high heat conductivity between the top plane 9d of the package 9a and the inner plane 8a of the upper housing 8. In the package 9a of the TOSA 9, for example, a semiconductor light emitting element, a circuit (drive circuit) that drives the semiconductor light emitting element, and an optical system that optically couples the semiconductor light emitting element and the sleeve 9b are mounted. The heat of the TOSA 9 generated by the semiconductor light emitting element and the drive circuit is conducted to the upper housing 8 through the heat conductive gel 28 and then dissipated from the upper housing 8 to the outside of the optical transceiver 1. Note that the heat conductive path formed by the heat conductive gel 28 preferably has a higher heat conductivity. For that, a contact area between the top plane 9d of the package 9a and the heat conductive gel 28 may be increased, a contact area between the inner plane 8a of the upper housing 8 and the heat conductive gel 28 may be increased, or a material having a high heat conductivity may be used as the heat conductive gel 28. Increasing the heat conductivity of the heat conductive path formed by the heat conductive gel 28 makes it possible to reduce thermal resistance between the package 9a and the upper housing 8. This allows the heat of the TOSA 9 to be easily conducted to the upper housing 8, which is suitable for heat dissipation.

As an example, a height H1 of the package 9a (a length in a thickness direction (vertical direction) of the optical transceiver 1) is 5.2 mm, and a thickness T1 of the resin member 26 is 0.05 mm or more and 0.25 mm or less. For example, a minimum value of the thickness T1 of the resin member 26, a minimum value of a thickness T2 of the heat conductive gel 28, and a minimum value of a thickness T3 of the name plate 27 are all 0.05 mm A height of the inner space S of the optical transceiver 1 (a distance between the inner plane 7a and the inner plane 8a) is suitably determined based on the above values.

Figure 9:
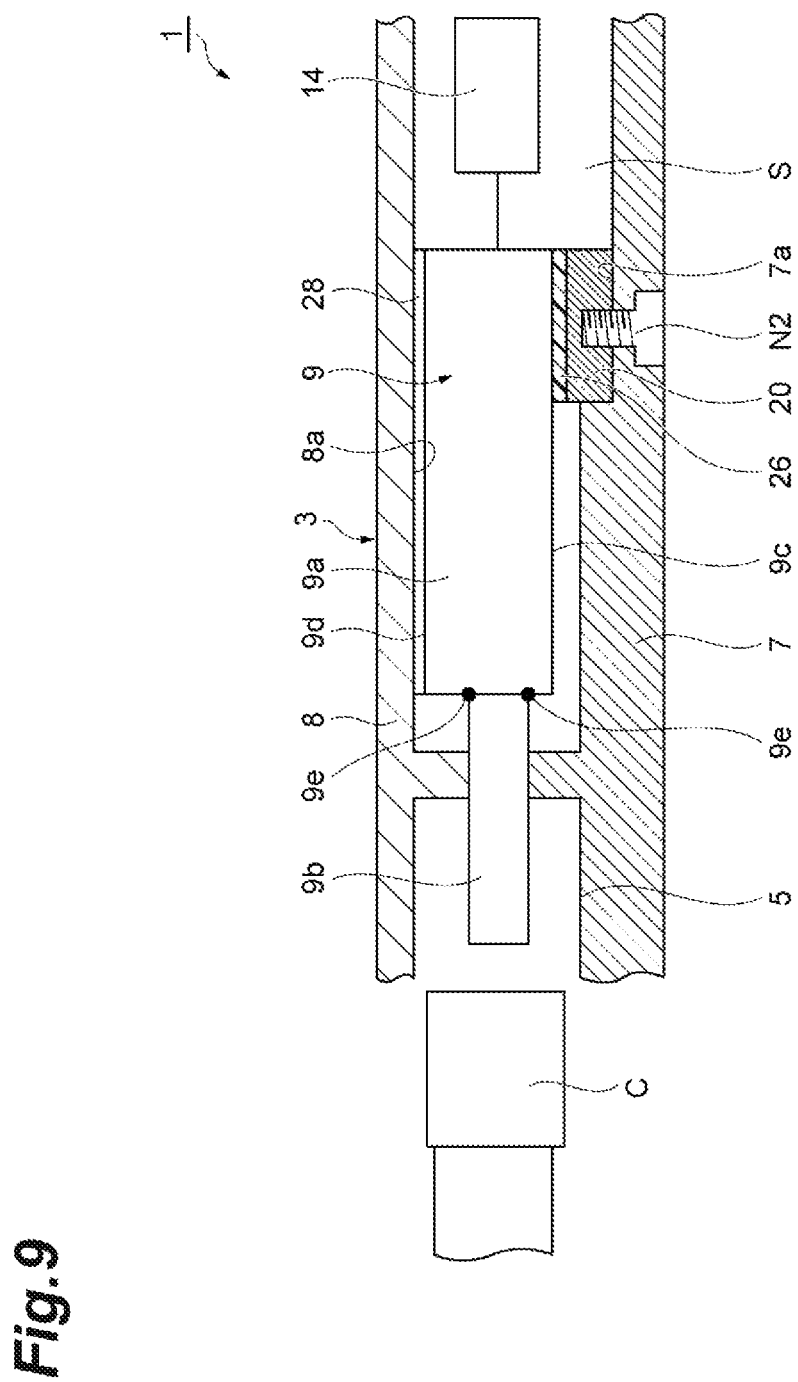
FIG. 9 is a longitudinal cross-sectional view schematically showing the internal structure of the optical transceiver shown in FIG. 1.

FIG. 9 is a cross-sectional view schematically showing the arrangement of components in the inner space S of the optical transceiver 1. The vertical direction in FIG. 9 (vertical positions of the lower housing 7 and the upper housing 8) is opposite to the vertical direction in FIG. 5. As described above, the housing 3 includes the receptacle 5 to be engaged with an optical connector C provided at the tip of the optical fiber cable. The circuit board 14 is provided on the opposite side of the TOSA 9 from the receptacle 5. The package 9a of the TOSA 9 is vertically sandwiched between the heat conductive gel 28 and the resin member 26. The heat conductive gel 28 is closely sandwiched between the inner plane 8a of the upper housing 8 and the top plane 9d of the package 9a. The resin member 26 is closely sandwiched between the fitting member 20 and the bottom plane 9c of the package 9a. Note that the name plate 27 is not shown in FIG. 9.

The fitting member 20 is closely sandwiched between the inner plane 7a of the lower housing 7 and the resin member 26 and is fixed to the inner plane 7a with the screws N2. As described above, the sleeve 9b extends from the package 9a, and the sleeve 9b is fixed to the package 9a by YAG welding. A YAG weld 9e is formed between the sleeve 9b and the package 9a.

Next, a description will be given in detail of effects obtained from the optical transceiver 1. The optical transceiver 1 has the inner space S, and the inner plane 8a (first plane), and the inner plane 7a (second plane) facing to each other and defining the inner space S. The optical transceiver 1 includes the housing 3 having the inner plane 8a and the inner plane 7a, and the TOSA 9 provided in the inside (inner space S) of the housing 3. The TOSA 9 includes the package 9a and the sleeve 9b attached to the package 9a and fixed to the housing 3. The heat conductive gel 28 that is plastic or deformable is closely sandwiched between the package 9a and the inner plane 8a. This causes heat generated from the package 9a to be conducted to the inner plane 8a of the housing 3 through the heat conductive gel 28, which makes it possible to increase heat dissipation of the TOSA 9.

The fitting member 20 is in contact with the inner plane 7a of the housing 3, and the resin member 26 is closely sandwiched between the package 9a and the fitting member 20. Accordingly, the package 9a is fixed to the inner plane 7a of the housing 3 with the resin member 26 and the fitting member 20 interposed. This makes it possible to suppress a reaction force applied to the package 9a and reduce a stress applied between the package 9a and the sleeve 9b. That is, the stress applied to the YAG weld 9e located between the sleeve 9b and the package 9a can be suppressed. Furthermore, the fitting member 20 is in contact with the inner plane 7a and is detachably fixed to the housing 3 (lower housing 7). This allows maintenance of components such as the TOSA 9 to be easily made after the fitting member 20 is removed from the housing 3. Therefore, rework can be easily made.

As described above, the heat conductive gel 28 is closely sandwiched between the package 9a and the inner plane 8a. Adjusting the thickness of the heat conductive gel 28 between the inner plane 8a of the upper housing 8 and the package 9a makes it possible to suppress a decrease in heat dissipation due to the misalignment of the package 9a relative to the housing 3. The heat conductive gel 28 is easily deformed as compared with other heat conductive members, so that the heat conductive gel 28 closely sandwiched between the inner plane 8a of the housing 3 and the package 9a can suppress a reaction force applied to the package 9a.

The fitting member 20 is detachably fixed to the inner plane 7a with the screws N2 inserted from the outside of the housing 3. This allows the fitting member 20 to be easily attached to and detached from the housing 3 with the screws N2, which in turn allows maintenance of components to be made more easily.

The resin member 26 is made of a material that is in liquid form while being injected the space between the fitting member 20 and the package 9a and hardens after the injection. Accordingly, the thickness of the resin member 26 injected into the space between the fitting member 20 and the package 9a can be easily adjusted, and the resin member 26 firmly holds the package 9a after hardening of the resin member 26. This makes it possible to more reliably reduce the stress applied to the YAG weld 9e between the package 9a and the sleeve 9b.

When the sleeve 9b is positioned with a deviation from a predetermined position and attached to the package 9a, the fitting member 20 may be adjusted in thickness in accordance with an amount of the deviation of the sleeve 9b. In this case, the fitting member 20 can be adjusted in thickness in accordance with the amount of deviation of the sleeve 9b.

Second Embodiment

Figure 10:
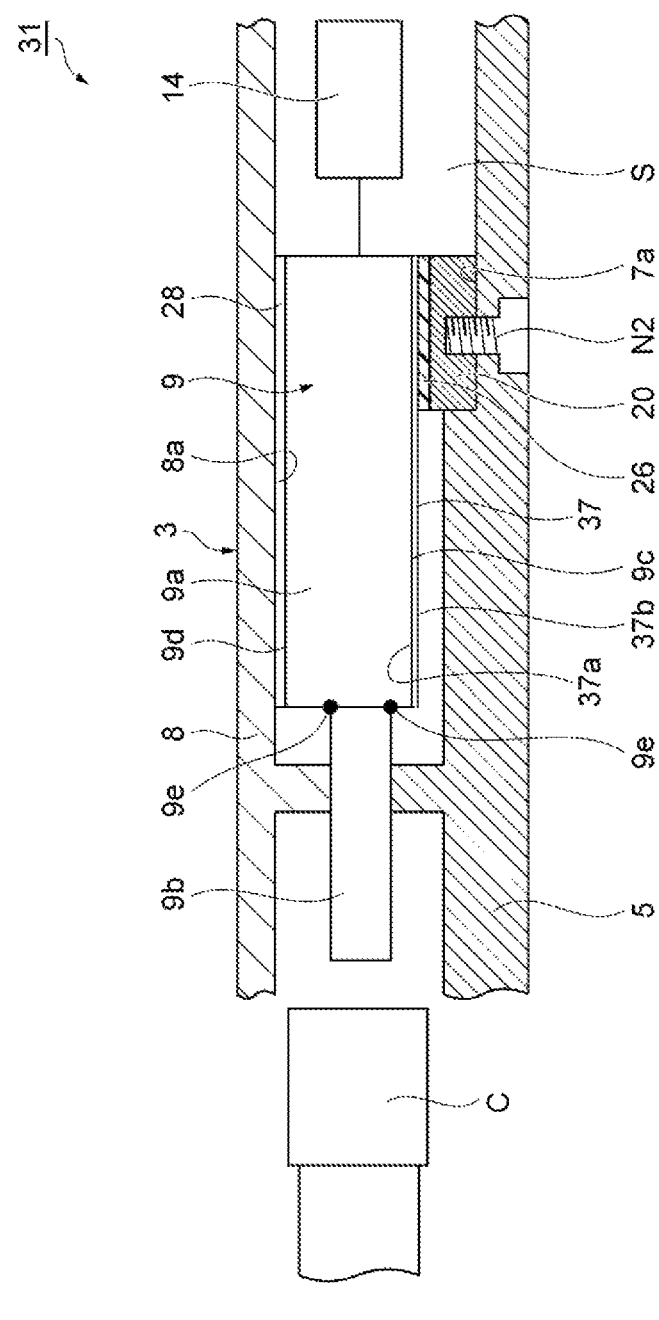
FIG. 10 is a longitudinal cross-sectional view schematically showing an internal structure of an optical transceiver according to a second embodiment.

A description will be given of an optical transceiver 31 according to a second embodiment with reference to FIG. 10. As shown in FIG. 10, the optical transceiver 31 differs from the optical transceiver 1 according to the first embodiment in that a tape 37 is used instead of the name plate 27. In the following description, in order to avoid duplication, the same description as the description given of the above-described first embodiment will be omitted as appropriate. The tape 37 has a first plane 37a in contact with the package 9a, and a second plane 37b that faces in a direction opposite to a direction in which the first plane 37a faces and is in contact with the resin member 26. For example, the tape 37 has tackiness on the first plane 37a and no tackiness on the second plane 37b. On the tape 37, a serial number identifying the TOSA 9 may be inscribed in the same manner as the name plate 27 described above.

As described above, the optical transceiver 31 according to the second embodiment includes the tape 37 closely sandwiched between the resin member 26 and the package 9a. The tape 37 closely sandwiched between the resin member 26 and the package 9a can suppress adhesion of the resin member 26 to the package 9a. Therefore, even after the resin member 26 hardens, the resin member 26 and the fitting member 20 can be easily removed from the package 9a, which in turn allows maintenance of components to be made more easily.

Third Embodiment

Figure 11:
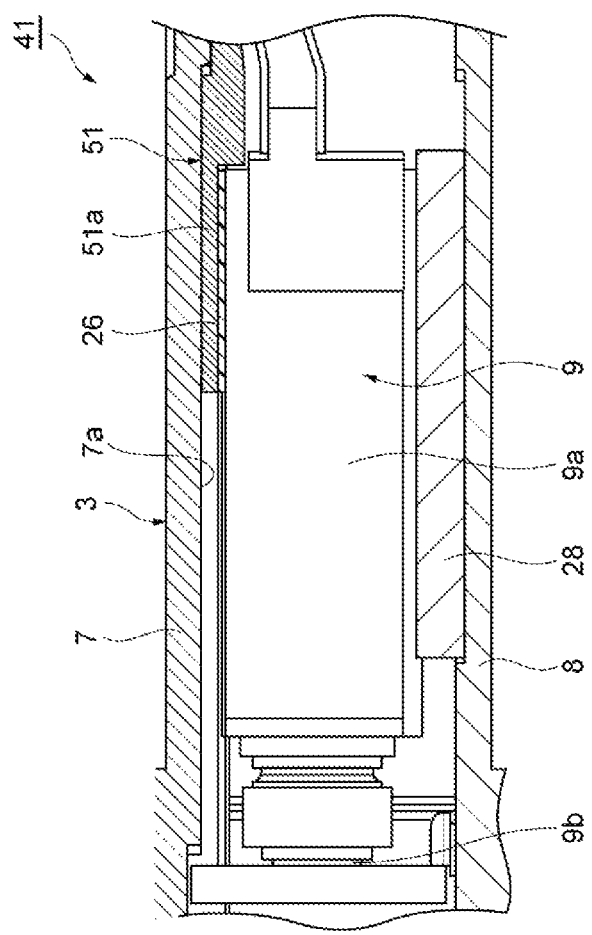
FIG. 11 is a longitudinal cross-sectional view showing a state where an optical module of an optical transceiver according to a third embodiment is slightly misaligned.
Figure 12:
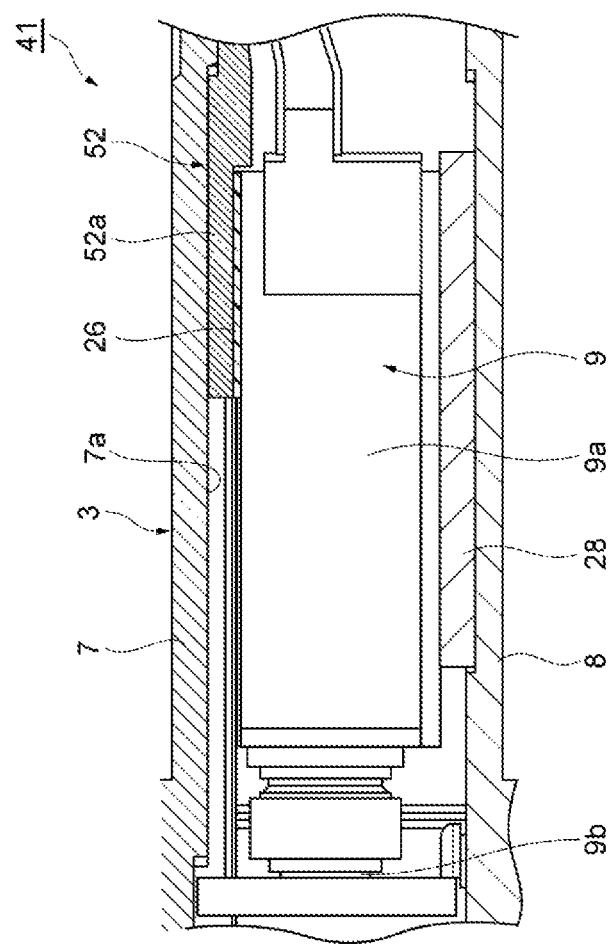
FIG. 12 is a longitudinal cross-sectional view showing a state where the optical module of the optical transceiver shown in FIG. 11 is not misaligned.
Figure 13:
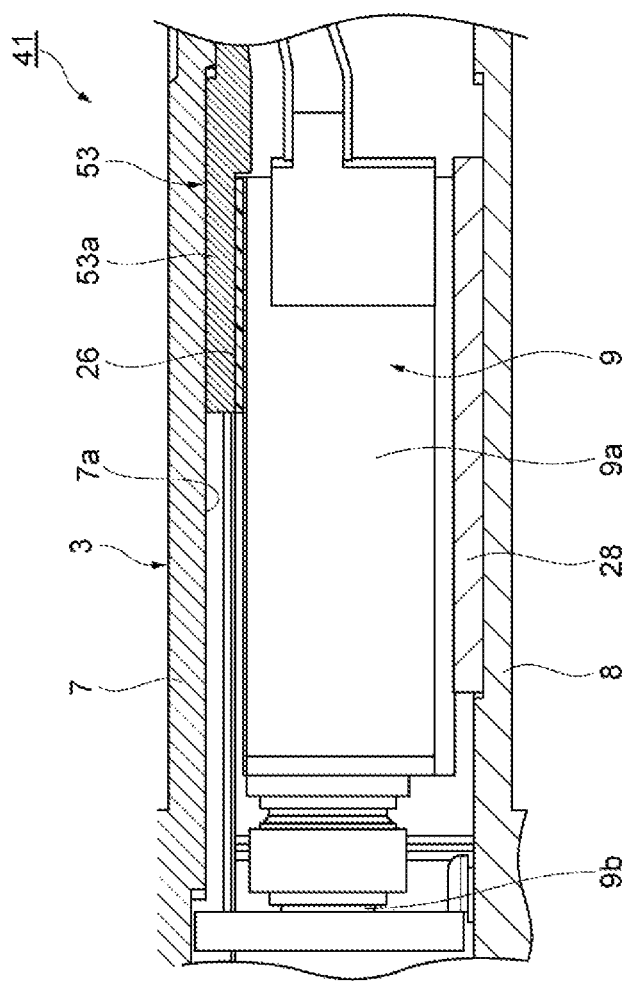
FIG. 13 is a longitudinal cross-sectional view showing a state where the optical module of the optical transceiver shown in FIG. 11 is misaligned in a direction opposite to misalignment direction of FIG. 11.

A description will be given of an optical transceiver 41 according to a third embodiment with reference to FIGS. 11 to 13. As described above, according to the first embodiment, the resin member 26 is adjusted in thickness in accordance with the misalignment amount of the package 9a. On the other hand, according to the third embodiment, a plurality of fitting members 51, 52, 53 are selectively used in accordance with the misalignment amount of the package 9a. The fitting members 51, 52, 53 respectively have mounting portions 51a, 52a, 53a similar to the mounting portion 21 of the fitting member 20 described above. The mounting portion 51a, the mounting portion 52a, and the mounting portion 53a are different in thickness from each other, the mounting portion 53a is the thickest, the mounting portion 52a is the second thickest, and the mounting portion 51a is the thinnest. On the other hand, regardless of the misalignment amount of the package 9a, the thickness of the resin member 26 is, for example, 0.05 mm or more and 0.25 mm or less. Accordingly, in the description given of the first embodiment, as a specific example, the thickness of the resin member 26 is in the range of from 0.05 mm to 0.65 mm, both inclusive, with respect to the misalignment amount of the package 9a ranging from −0.3 mm to +0.3 mm, both inclusive, and therefore, the variation in thickness can be suppressed to one third. Assuming that the contact area between the resin member 26 and each of the fitting members 51, 52, 53 and the contact area between the resin member 26 and the package 9a are not varied, the variation in volume of the resin member 26 injected into the space between the package 9a and each of the fitting members 51, 52, 53 can be also suppressed to one third by suppressing the variation in thickness to one third. When the resin member 26 varies in volume, for example, a time required to cause the resin member 26 to harden, a temperature to which the resin member 26 is heated, or a range of an amount of ultraviolet rays applied to the resin member 26 increases accordingly. Therefore, suppressing the variation in volume of the resin member 26 makes it possible to narrow a range of the manufacturing condition for hardening and thus increase manufacturability of the optical transceiver 41.

As described above, according to the third embodiment, the gap between the lower housing 7 and the package 9a can be easily filled with each of the plurality of fitting members 51, 52, 53 having different thicknesses. Accordingly, even when the resin member 26 is not made of a deformable material, the selective use of the fitting members 51, 52, 53 having different thicknesses makes it possible to accommodate the misalignment amount of the package 9a. Therefore, each of the fitting members 51, 52, 53 and the resin member 26 closely sandwiched between the inner plane 7a of the lower housing 7 and the package 9a can firmly hold the package 9a. As a result, the stress applied to the YAG weld between the package 9a and the sleeve 9b can be further reduced.

The description has been given above of the embodiments of the optical transceiver according to the present disclosure, but the present disclosure is not limited to the above-described embodiments. That is, it is easily recognized by those skilled in the art that various changes and modifications can be made within the scope of the present disclosure set forth in the claims. For example, the shape, size, material, number, and disposition of each of the fitting members 20, 51, 52, 53 can be changed as appropriate.

For example, in the above-described embodiments, the description has been given of an example where the fitting member 20, the resin member 26, the name plate 27, the TOSA 9, and the heat conductive gel 28 are housed in the inner space S of the optical transceiver 1. However, the present disclosure is not limited to this example, and, for example, a heat dissipating sheet may be used instead of the heat conductive gel 28, and the name plate 27 may be omitted. Further, in the above-described embodiments, the description has been given of the optical transceiver 1 that conforms to the QSFP28 standard and performs full-duplex bidirectional optical communication. However, the optical transceiver according to the present disclosure may be an optical transceiver conforming to a standard other than the QSFP28 standard, such as the SFP standard, for example.

What is claimed is:

1. An optical transceiver comprising:
a housing having a first plane and a second plane facing to each other, the first plane and the second plane defining an inner space;
an optical module including a package and a sleeve attached to the package, the sleeve being fixed to the housing, the package being housed in the inner space;
a heat conductive member closely sandwiched between the package and the first plane, the heat conductive member being deformable;
a fitting member detachably fixed to the second plane; and
a resin member closely sandwiched between the package and the fitting member;
wherein when the package is positioned with a deviation from a standard position between the first plane and the second plane, the fitting member is adjusted in thickness in order to cancel the deviation.

2. The optical transceiver according to claim 1, wherein the heat conductive member is a heat conductive gel.

3. The optical transceiver according to claim 1, wherein the fitting member has a hole allowing the fitting member to be fixed to the second plane with a screw.

4. The optical transceiver according to claim 1, further comprising a non-conducting tape covering the package in order to prevent the package from bonding to the resin member.

5. The optical transceiver according to claim 1, wherein the resin member is made of a thermosetting resin.

* * * * *